United States Patent
Jung et al.

(10) Patent No.: US 8,379,177 B2
(45) Date of Patent: Feb. 19, 2013

(54) ARRAY SUBSTRATE FOR FRINGE FIELD SWITCHING MODE LIQUID CRYSTAL DISPLAY DEVICE AND METHOD OF FABRICATING THE SAME

(75) Inventors: Bo-Young Jung, Gumi-si (KR); In-Duk Song, Gumi-si (KR); Sung-Il Park, Daegu (KR); Dae-Lim Park, Chilgok-gun (KR)

(73) Assignee: LG Display Co., Ltd., Seoul (KR)

( * ) Notice: Subject to any disclaimer, the term of this patent is extended or adjusted under 35 U.S.C. 154(b) by 168 days.

(21) Appl. No.: 12/856,465

(22) Filed: Aug. 13, 2010

(65) Prior Publication Data

US 2011/0080549 A1    Apr. 7, 2011

(30) Foreign Application Priority Data

Oct. 6, 2009    (KR) .................. 10-2009-0094694

(51) Int. Cl.
*G02F 1/1343* (2006.01)
*G02F 1/1345* (2006.01)
(52) U.S. Cl. ......... 349/143; 349/139; 349/149; 349/152
(58) Field of Classification Search .................. None
See application file for complete search history.

(56) References Cited

U.S. PATENT DOCUMENTS

| | | | | |
|---|---|---|---|---|
| 6,432,734 B1 * | 8/2002 | Chen et al. | ...................... | 438/30 |
| 2005/0030461 A1 * | 2/2005 | Ono et al. | ...................... | 349/141 |
| 2006/0267914 A1 * | 11/2006 | Chang et al. | .................. | 345/100 |
| 2007/0013773 A1 * | 1/2007 | Tsuchiya et al. | ................. | 348/87 |
| 2008/0180622 A1 * | 7/2008 | Horiguchi et al. | ............. | 349/139 |
| 2008/0239215 A1 * | 10/2008 | Chae | .............................. | 349/107 |
| 2008/0291377 A1 * | 11/2008 | Sekiguchi et al. | ............. | 349/114 |
| 2009/0027579 A1 * | 1/2009 | Aota et al. | ........................ | 349/41 |
| 2009/0108259 A1 * | 4/2009 | Lin et al. | .......................... | 257/59 |

FOREIGN PATENT DOCUMENTS

CN    101354513 A    1/2009

* cited by examiner

*Primary Examiner* — Mike Stahl

(74) *Attorney, Agent, or Firm* — Birch, Stewart, Kolasch & Birch, LLP

(57) ABSTRACT

An array substrate for a fringe field switching mode liquid crystal display device includes a substrate including a display region and a non-display; a gate line on the substrate and in the display region; a common pad on the substrate and in the non-display region; a gate insulating layer on the gate line and the common pad; a data line on the gate insulating layer and crossing the gate line to define a pixel region in the display region; a thin film transistor connected to the gate and data lines; a first passivation layer on the data line and the thin film transistor; a common electrode on the first passivation layer and covering an entire surface of the display region; a second passivation layer on the common electrode; and a pixel electrode on the second passivation layer and having a plate shape in each pixel region.

29 Claims, 15 Drawing Sheets

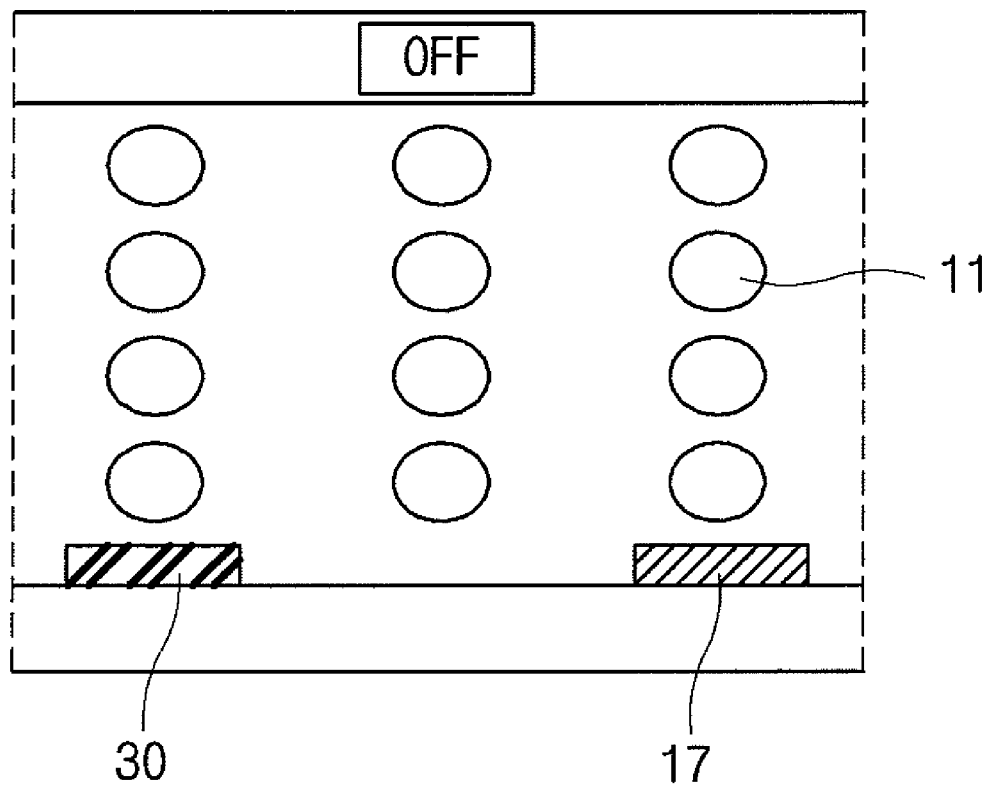

ARRAY SUBSTRATE FOR FRINGE FIELD SWITCHING MODE LIQUID CRYSTAL DISPLAY DEVICE AND METHOD OF FABRICATING THE SAME

The present application claims the benefit of Korean Patent Application No. 10-2009-0094694 filed in Korea on Oct. 6, 2009, which is hereby incorporated by reference.

BACKGROUND OF THE INVENTION

1. Field of the Invention

The present invention relates to an array substrate for a fringe field switching (FFS) mode liquid crystal display (LCD) device and more particularly to an array substrate for an FFS mode LCD device being capable of minimizing a parasitic capacitance between a pixel electrode and a data line and a method of fabricating the array substrate being capable of reducing production costs.

2. Discussion of the Related Art

A related art liquid crystal display (LCD) device uses optical anisotropy and polarization properties of liquid crystal molecules. The liquid crystal molecules have a definite alignment direction as a result of their thin and long shapes. The alignment direction of the liquid crystal molecules can be controlled by applying an electric field across the liquid crystal molecules. In other words, as the intensity or direction of the electric field is changed, the alignment of the liquid crystal molecules also changes. Since incident light is refracted based on the orientation of the liquid crystal molecules due to the optical anisotropy of the liquid crystal molecules, images can be displayed by controlling light transmissivity.

Since the LCD device including a thin film transistor (TFT) as a switching element, referred to as an active matrix LCD (AM-LCD) device, has excellent characteristics of high resolution and displaying moving images, the AM-LCD device has been widely used.

The AM-LCD device includes an array substrate, a color filter substrate and a liquid crystal layer interposed therebetween. The array substrate may include a pixel electrode and the TFT, and the color filter substrate may include a color filter layer and a common electrode. The AM-LCD device is driven by an electric field between the pixel electrode and the common electrode to have excellent properties of transmittance and aperture ratio. However, since the AM-LCD device uses a vertical electric field, the AM-LCD device has a bad viewing angle.

An in-plane switching (IPS) mode LCD device may be used to resolve the above-mentioned limitations. FIG. 1 is a cross-sectional view of an IPS mode LCD device according to the related art. As shown in FIG. 1, the array substrate and the color filter substrate are separated and face each other. The array substrate includes a first substrate 10, a common electrode 17 and a pixel electrode 30. Though not shown, the array substrate may include a TFT, a gate line, a data line, and so on. The color filter substrate includes a second substrate 9, a color filter layer (not shown), and so on. A liquid crystal layer 11 is interposed between the first substrate 10 and the second substrate 9. Since the common electrode 17 and the pixel electrode 30 are formed on the first substrate 10 on the same level, a horizontal electric field "L" is generated between the common and pixel electrodes 17 and 30.

FIGS. 2A and 2B are cross-sectional views showing turned on/off conditions of an IPS mode LCD device according to the related art. As shown in FIG. 2A, when the voltage is applied to the IPS mode LCD device, liquid crystal molecules 11a above the common electrode 17 and the pixel electrode 30 are unchanged. But, liquid crystal molecules 11b between the common electrode 17 and the pixel electrode 30 are horizontally arranged due to the horizontal electric field "L". Since the liquid crystal molecules are arranged by the horizontal electric field, the IPS mode LCD device has a characteristic of a wide viewing angle. FIG. 2B shows a condition when the voltage is not applied to the IPS mode LCD device. Because an electric field is not generated between the common and pixel electrodes 17 and 30, the arrangement of liquid crystal molecules 11 is not changed.

A fringe field switching (FFS) mode LCD device having additional advantages has been introduced. FIG. 3 is a plane view showing one pixel region of an array substrate for an FFS mode LCD device according to the related art, and FIG. 4 is a cross-sectional view taken along the line IV-IV of FIG. 3.

Referring to FIGS. 3 and 4, a gate line 60 is formed along a first direction on a substrate 51 of an array substrate 50, and a data line 70 along a second direction cross the gate line 60 to define a pixel region P. A thin film transistor (TFT) Tr, which includes a gate electrode 62, a gate insulating layer 64, a semiconductor layer 66, a source electrode 72 and a drain electrode 74, is formed at a crossing portion of the gate and data lines 60 and 70. The TFT Tr is disposed in a switching region TrA defined in the pixel region P. The TFT Tr is connected to the gate and data lines 60 and 70. Namely, the gate electrode 62 is connected to the gate line 60, and the source electrode 72 is connected to the data line 70. The semiconductor layer 66 includes an active layer 66a of intrinsic amorphous silicon and an ohmic contact layer 66b of impurity-doped amorphous silicon.

In addition, a pixel electrode 76, which is connected to the drain electrode 74 of the TFT Tr, is formed in the pixel region P. A passivation layer 80 as an insulating layer is disposed on the pixel electrode 76 and the TFT Tr. A common electrode 90 having a plate shape is disposed on the passivation layer 80. The common electrode 90 includes a plurality of holes 92 of a slit shape. The holes 92 overlap the pixel electrode 76. The pixel electrode 76 covers the pixel region P, and the common electrode 90 covers an entire surface of the substrate 51.

With voltages to the pixel electrode 76 and the common electrode 90, a fringe field is generated between the pixel and common electrodes 76 and 90 such that liquid crystal molecules are driven by the fringe field.

As shown in FIG. 4, in the related art FFS mode LCD device, the pixel electrode 76 is positioned to be closer to the data line 70 such that a parasitic capacitance is generated between the pixel electrode 76 and the data line 70. Problems, i.e, a flicker phenomenon, are generated by the parasitic capacitance. Particularly, when a size of the pixel electrode 76 is increased to improve an aperture ratio, the problems are serious because a distance between the pixel electrode 76 and the data line 70 is further decreased.

SUMMARY OF THE INVENTION

Accordingly, the present invention is directed to an array substrate for an FFS mode LCD device and a method of fabrication the same that substantially obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for a fringe field switching mode liquid crystal display device includes a substrate including a display region and a non-display region at a periphery of the display region; a gate line on the substrate and in the display region; a common pad on the substrate and in the non-display region; a gate insulating layer on the gate line and the common pad; a data line on the gate insulating layer and crossing the gate line to define a pixel region in the display region; a thin film transistor connected to the gate and data lines and positioned in the pixel region; a first passivation layer on the data line and the thin film transistor; a common electrode on the first passivation layer and covering an entire surface of the display region; a second passivation layer on the common electrode; and a pixel electrode on the second passivation layer and having a plate shape in each pixel region, the pixel electrode connected to the thin film transistor and having a first opening.

In another aspect of the present invention, a method of fabrication an array substrate for a fringe field switching mode liquid crystal display device includes forming a gate line and a common pad on a substrate including a display region and a non-display region at a periphery of the display region, the gate line disposed in the display region and the common pad disposed in the non-display region; forming a gate insulating layer on the gate line and the common pad; forming a data line, which is disposed on the gate insulating layer and crosses the gate line to define a pixel region in the display region, and a thin film transistor in the pixel region, the thin film transistor connected to the gate and data lines; forming a first passivation layer on the data line and the thin film transistor; forming a common electrode on the first passivation layer and covering an entire surface of the display region; forming a second passivation layer on the common electrode; patterning the second passivation layer, the first passivation layer and the gate insulating layer to form a first common contact hole exposing the common pad; patterning the second passivation layer to form a second common contact hole exposing the common electrode; patterning the second passivation layer and the first passivation layer to form a drain contact hole exposing a portion of the thin film transistor; forming a pixel electrode on the second passivation layer and having a plate shape in each pixel region, the pixel electrode connected to the thin film transistor through the drain contact hole and having a first opening; and forming a connection pattern for connecting the common electrode to the common pad and disposed on the second passivation layer. In another aspect to the present invention, an array substrate for a fringe field switching mode liquid crystal display device includes a substrate including a display region and a non-display region at a periphery of the display region; a gate line and a gate electrode connected the gate line on the substrate and in the display region; a first common pad on the substrate and in the non-display region; a gate insulating layer on the gate line, gate electrode and the first common pad; a data line and a source electrode connected to the data line on the gate insulating layer and the data line crossing the gate line to define a pixel region in the display region; a second common pad on the gate insulating layer and in the non-display region; a thin film transistor connected to the gate and data lines and positioned in the pixel region; a first passivation layer on the data line, the second common pad and the thin film transistor; a common electrode on the first passivation layer and covering an entire surface of the display region; a second passivation layer on the common electrode; a pixel electrode on the second passivation layer and having a plate shape in each pixel region, the pixel electrode connected to the thin film transistor and having at least one opening; a first connection pattern for connecting the common electrode to the first common pad and disposed on the second passivation layer; a second connection pattern for connecting the common electrode to the second common pad and disposed on the second passivation layer; and a third connection pattern for connecting the first common pad to the second common pad and disposed on the second passivation layer.

In another aspect to the present invention, a method of fabrication an array substrate for a fringe field switching mode liquid crystal display device includes forming a gate line, a gate electrode and a first common pad on a substrate including a display region and a non-display region at a periphery of the display region, the gate line disposed in the display region and the first common pad disposed in the non-display region; forming a gate insulating layer on the gate line, the gate electrode and the first common pad; forming a data line, which is disposed on the gate insulating layer and crosses the gate line to define a pixel region in the display region, a second common pad, which is disposed on the gate insulating layer in the non-display region, and a thin film transistor in the pixel region, the thin film transistor connected to the gate and data lines; forming a first passivation layer on the data line, the second common pad and the thin film transistor; forming a common electrode on the first passivation layer and covering an entire surface of the display region; forming a second passivation layer on the common electrode; forming a first contact hole exposing one portion of the common electrode, a second contact hole exposing one portion of the first common pad, a third contact hole exposing the other portion of the common electrode, a forth contact hole exposing one portion of the second common pad, a fifth contact hole exposing the other portion of the first common pad, a sixth contact hole exposing the other portion of the second common pad and a drain contact hole exposing a portion of the thin film transistor; and forming a pixel electrode on the second passivation layer and in each pixel region and first to third connection patterns on the second passivation layer, the pixel electrode connected to the thin film transistor through the drain contact hole and having at least one opening, the first connection pattern connecting the common electrode to the first common pad through the first and second contact holes, the second connection pattern connecting the common electrode to the second common pad through the third and fourth contact holes, and the third connection pattern connecting the first common pad to the second common pad through the fifth and sixth contact holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 2A and 2B are cross-sectional views showing turned on/off conditions of an IPS mode LCD device according to the related art.

DETAILED DESCRIPTION OF THE PREFERRED EMBODIMENTS

Reference will now be made in detail to the preferred embodiments, examples of which are illustrated in the accompanying drawings.

Figure 1:
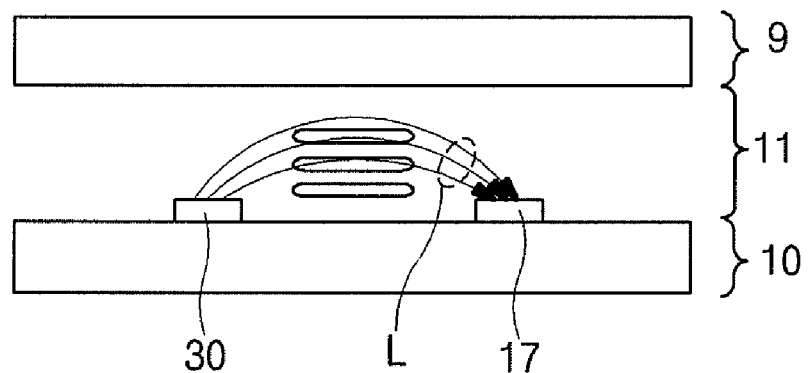
FIG. 1 is a cross-sectional view of an IPS mode LCD device according to the related art.
Figure 2A:
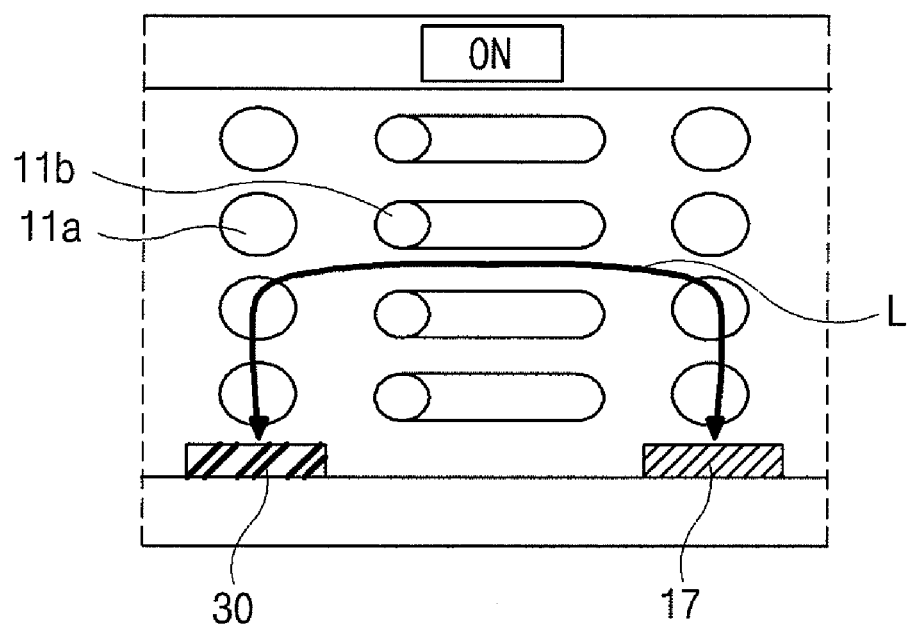
Figure 3:
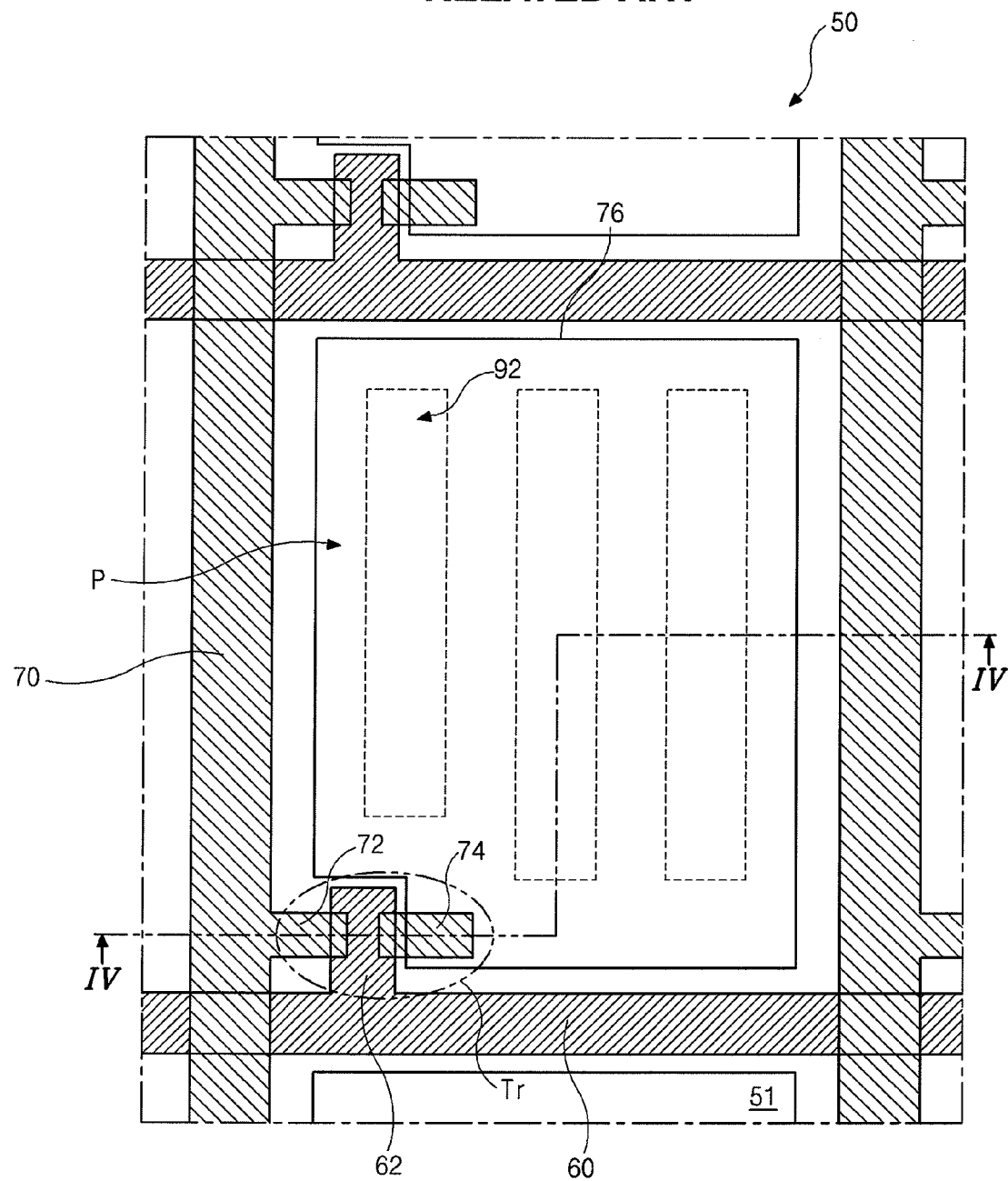
FIG. 3 is a plane view showing one pixel region of an array substrate for an FFS mode LCD device according to the related art.
Figure 4:
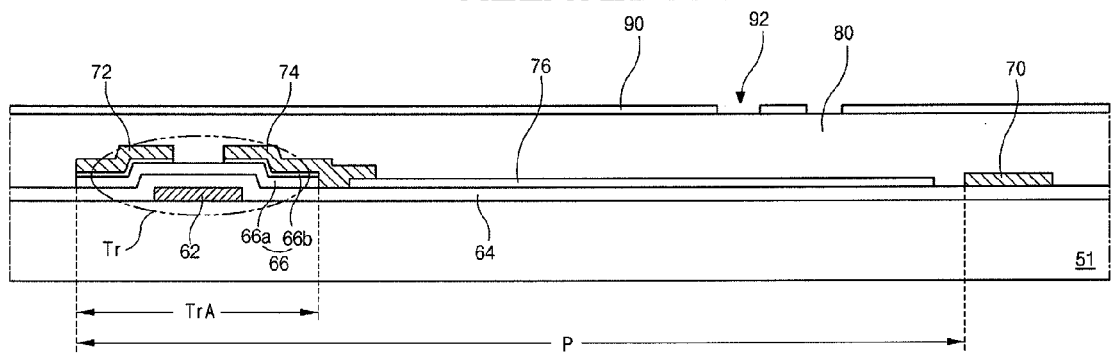
FIG. 4 is a cross-sectional view taken along the line IV-IV of FIG. 3.
Figure 5:
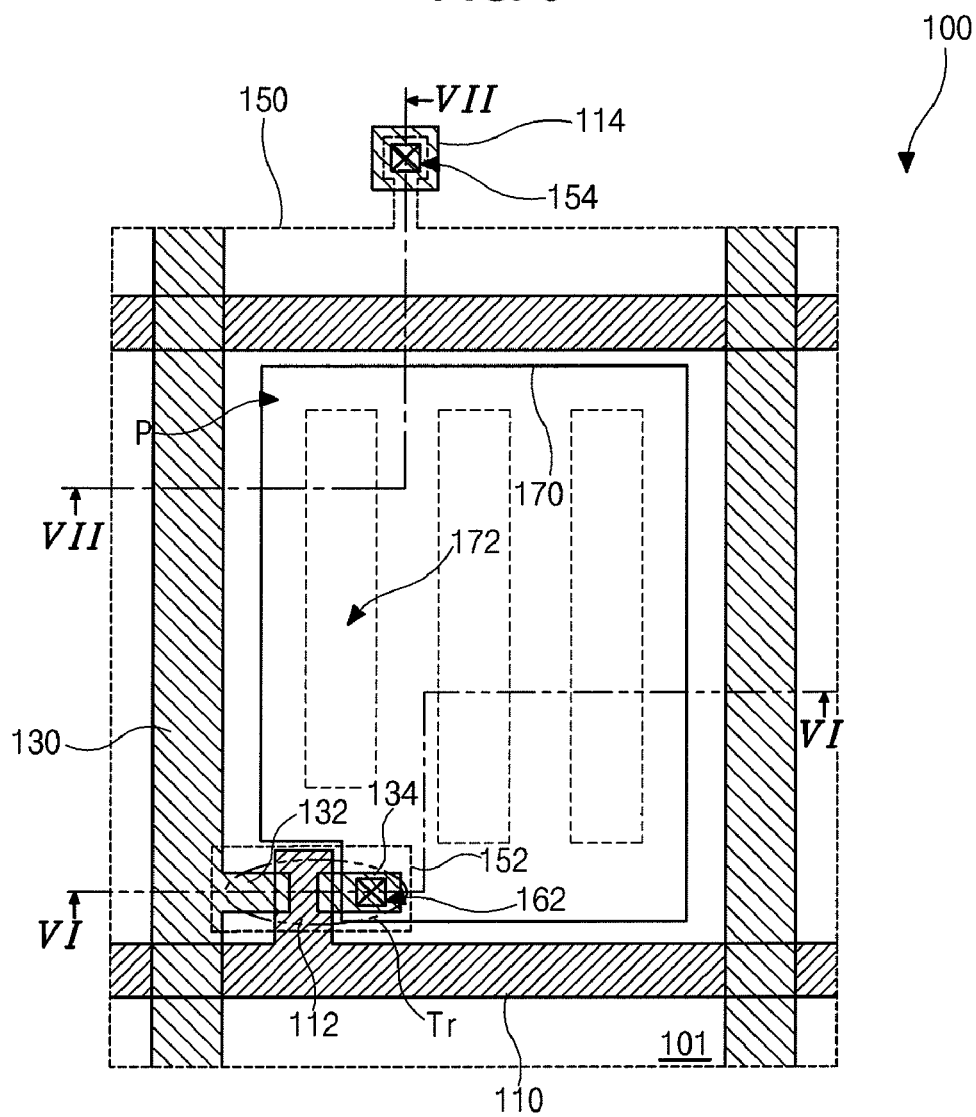
FIG. 5 is a plane view of an array substrate for an FFS mode LCD device according to a first embodiment of the present invention.

FIG. 5 is a plane view of an array substrate for an FFS mode LCD device according to a first embodiment of the present invention.

Referring to FIG. 5, an array substrate 100 for an FFS mode LCD device includes a gate line 110, a data line 130, a thin film transistor (TFT) Tr, a pixel electrode 170, a common electrode 150 and a common pad 114 on a substrate 101.

The gate line 110 extends along a first direction, and the data line 130 extends along a second direction such that the gate and data lines 110 and 130 cross each other to define a pixel region P. The substrate 101 is classified into a display region for displaying an image and a non-display region at a periphery of the display region. Namely, the display region is surrounded by the outmost gate line 110 and the outmost data line 130. The pixel region P is defined in the display region.

The TFT Tr is disposed in the pixel region P and at a crossing portion of the gate and data lines 110 and 130. The TFT Tr is connected to the gate and data lines 110 and 130.

The TFT Tr includes a gate electrode 112, a gate insulating layer (not shown), a semiconductor layer (not shown), a source electrode 132 and a drain electrode 134. The semiconductor layer includes an active layer (not shown) of intrinsic amorphous silicon and an ohmic contact layer (not shown) of impurity-doped amorphous silicon. Namely, the gate electrode 112 is connected to the gate line 110, and the source electrode 132 is connected to the data line 130.

The common electrode 150 is formed of a transparent conductive material, i.e., indium-tin-oxide (ITO) or indium-zinc-oxide (IZO). The common electrode 150 covers an entire surface of the display region of the substrate 101 and includes a first opening 152 corresponding to the TFT Tr to avoid an electrical interference of the common electrode 150 with the source and drain electrodes 132 and 134 and an electrical connection of the common electrode 150 with the pixel electrode 170. Alternatively, the common electrode 150 can cover an entire surface of the display region without an electrical connection with the pixel electrode 170.

The pixel electrode 170 in the pixel region P is connected to the drain electrode 134 of the TFT Tr through a drain contact hole 162. The pixel electrode 170 is insulated from the common electrode 150 with a passivation layer (not shown) of an insulating material. The pixel electrode 170 in each pixel region P has a plate shape. The pixel electrode 170 has a plurality of second openings 172 corresponding to the common electrode 150. For example, each second opening 172 may has a rectangular shape. Each of the common and pixel electrodes 150 and 170 is formed of a transparent conductive material layer such as indium-tin-oxide (ITO) and indium-zinc-oxide (IZO).

In addition, the common pad 114 for applying a common voltage into the common electrode 150 is disposed in the non-display region. The common electrode 150 is electrically connected to the common pad 114 through a common contact hole 154. FIG. 5 shows the common pad 114 is disposed between two adjacent data lines 130. Alternatively, the common pad 114 may be disposed at one side of the non-display region to avoid an electrical interference between the common pad 114 and the data line 130.

Although not shown, a gate pad connected to one end of the gate line 110 and a data pad connected to the data line 130 are disposed in the non-display region.

Figure 6:
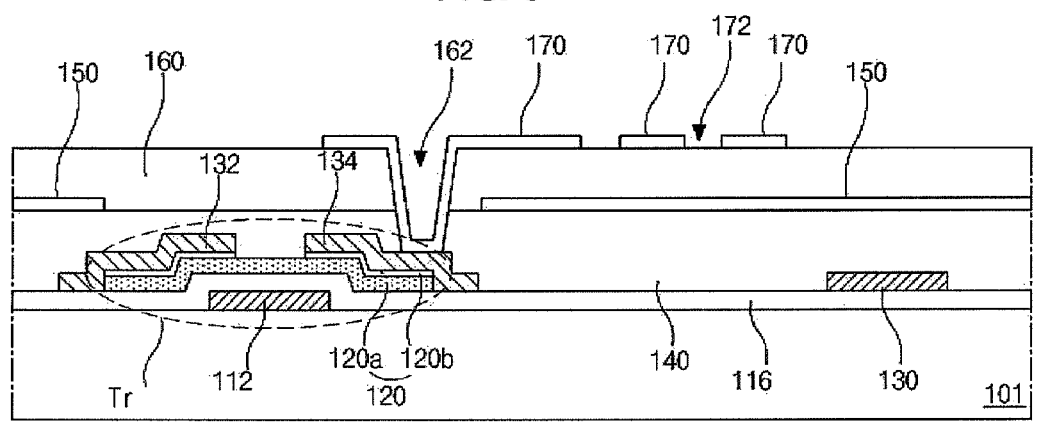
FIG. 6 is a cross-sectional view taken along the line VI-VI of FIG. 5.
Figure 7:
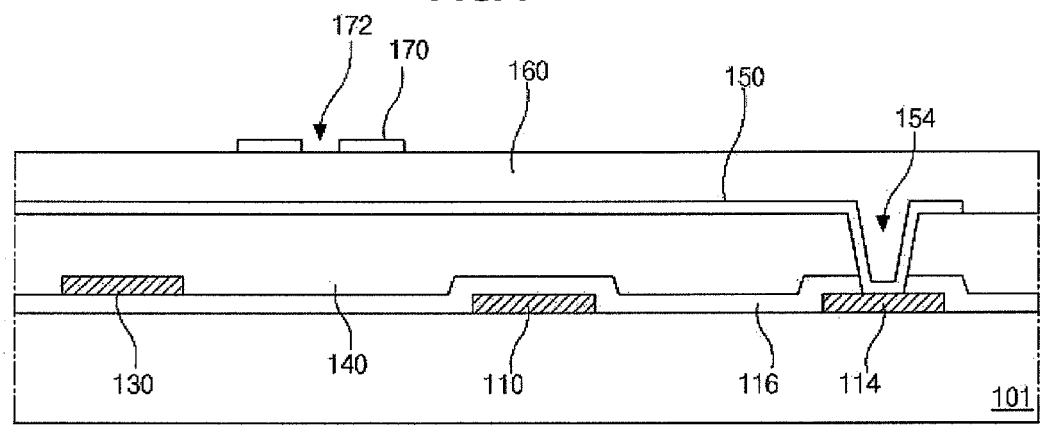
FIG. 7 is a cross-sectional view taken along the line VII-VII of FIG. 5.

FIG. 6 is a cross-sectional view taken along the line VI-VI of FIG. 5, and FIG. 7 is a cross-sectional view taken along the line VII-VII of FIG. 5.

Referring to FIGS. 5 to 7, the gate line 110 along the first direction is formed on the substrate 101 and in the display region. The gate electrode 112, which is connected to the gate line 110, is disposed in the pixel region P and on the substrate 101. Namely, the gate electrode 112 extends from the gate line 110. In addition, the common pad 114 is disposed on the substrate 101 and in the non-display region. Although not shown, the gate pad is disposed at one end of the gate line 110.

On the gate line 110, the gate electrode 112 and the common pad 114, the gate insulating layer 116 of an insulating material is disposed. For example, the gate insulating layer 116 is formed of an inorganic insulating material such as silicon oxide ($SiO_2$) and silicon nitride ($SiN_x$). For example, the gate insulating layer 116 has a thickness of about 3800 angstroms.

On the gate insulating layer 116, the semiconductor layer 120 is disposed. The semiconductor layer 120 includes the active layer 120a of intrinsic amorphous silicon and the ohmic contact layer 120b of impurity-doped amorphous silicon. A center of the active layer 120a is exposed through the ohmic contact layer 120b.

On the semiconductor layer 120, the source electrode 132 and the drain electrode 134, which are spaced apart from each other, are disposed. The center portion of the active layer 120a is also exposed through a space between the source and drain electrodes 132 and 134.

The gate electrode 112, the gate insulating layer 116, the semiconductor layer 120, the source electrode 132 and the drain electrode 134 constitute the TFT Tr.

On the gate insulating layer 116, the data line 130 along the second direction is disposed. The data line 130 crosses the gate line 110 such that the pixel region P is defined. The data line 130 is connected to the source electrode 132 of the TFT Tr. Namely, the data line 130 extends from the source electrode 132. Although not shown, the data pad is formed at one end of the data line 130.

A first passivation layer 140 is disposed to cover the TFT Tr and the data line 130. For example, the first passivation layer 140 is formed of an organic insulating material, for example, photo-acryl or benzocyclobutene (BCB), or an inorganic insulating material, for example, silicon oxide or silicon nitride. For example, the first passivation layer 140 is formed of the inorganic insulating material and has a thickness of about 4000 angstroms. The common contact hole 154 exposing the common pad 114 is formed through the first passivation layer 140 and the gate insulating layer 116. Namely, the first passivation layer 140 and the gate insulating layer 116 have the common contact hole 154 for exposing the common pad 114.

On the first passivation layer 140, the common electrode 150 of the transparent conductive material is disposed. The common electrode 150 contacts the common pad 114 through the common contact hole 154. The common electrode 150 has a plate shape covering an entire surface of the display region including the pixel regions P. The common electrode 150 has the first opening 152 corresponding to the TFT Tr to avoid an electrical connection with the pixel electrode 170 and an electrical interference with the TFT Tr.

A second passivation layer 160 is disposed on the common electrode 150. For example, the second passivation layer 160 is formed of an organic insulating material, for example, photo-acryl or benzocyclobutene (BCB), or an inorganic insulating material, for example, silicon oxide or silicon nitride. For example, the second passivation layer 160 is formed of the inorganic insulating material and has a thickness of about 2000 angstroms. The drain contact hole 162 exposing the drain electrode 134 is formed through the second passivation layer 160 and the first passivation layer 140. Namely, the first passivation layer 140 and the second passivation layer 160 have the drain contact hole 162 for exposing the drain electrode 134.

On the second passivation layer 160, the pixel electrode 170 of the transparent conductive material is disposed. The pixel electrode 170 contacts the drain electrode 132 through the drain contact hole 162 such that the pixel electrode 170 is electrically connected to the TFT Tr. The pixel electrode 170 has the second openings 172 corresponding to the common electrode 150. The pixel electrode 170 overlaps the common electrode 150 with the second passivation layer 160 therebetween such that a fringe field is generated between the pixel and common electrodes 170 and 150.

In the above array substrate 100 for the FFS mode LCD device according to the present invention, the pixel electrode 170 is spaced apart from the data line 130 with the first and second passivation layers 140 and 160 such that a parasitic capacitance between the pixel electrode 170 and the data line 130 can be reduced. In addition, the common electrode 150 between the pixel electrode 170 and the data line 130 serves as a blocking wall such that the parasitic capacitance between the pixel electrode 170 and the data line 130 can be further reduced.

Furthermore, since the first passivation layer 140 has a thickness greater than the second passivation layer 160, an electrical interference between the common electrode 150 and the data line 130 or/and between the common electrode 150 and the TFT Tr can be decreased. Moreover, since the second passivation layer 160 has a thickness smaller than the first passivation layer 140, an electrical field between the common and pixel electrodes 150 and 170 is strengthened.

A fabricating method of the above array substrate 100 will be explained below in brief.

On the substrate 101, the gate line 110, the gate electrode 112 and the common pad 114 is formed by a first mask process. Each of the gate line 110, the gate electrode 112 and the common pad 114 is formed of a metallic material.

Next, the gate insulating layer 116 is formed on the gate line 110, the gate electrode 112 and the common pad 114.

Next, the semiconductor layer 120 including the active layer 120a and the ohmic contact layer 120b is formed on the gate insulating layer 116 by a second mask process.

Next, the data line 130, the source electrode 132 and the drain electrode 134 are formed by a third mask process.

Next, the first passivation layer 140 of an inorganic insulating material or an organic insulating material is formed. Then, the first passivation layer 140 and the gate insulating layer 116 are patterned to form the common contact hole 154, which exposes the common pad 114, by a fourth mask process.

Next, a first transparent conductive material layer is formed on the first passivation layer 140, and the first transparent conductive material layer is patterned to form the common electrode 150, which contacts the common pad 114 through the common contact hole 154, by a fifth mask process. Since the first transparent conductive material layer in the non-display region and corresponding to the TFT Tr should be removed, the fifth mask process is required.

Next, the second passivation layer 160 an inorganic insulating material or an organic insulating material is formed. Then, the second passivation layer 160 and the first passivation layer 140 are patterned to form the drain contact hole 162, which exposes the drain electrode 134, by a sixth mask process.

Next, a second transparent conductive material layer is formed on the second passivation layer 160, and the second transparent conductive material layer is patterned to form the pixel electrode 170, which contacts the drain electrode 134 through the drain contact hole 162 and includes the second openings 172, by a seven mask process.

By the above first to seven mask process, the array substrate 100 shown in FIG. 5 is obtained. Namely, seven mask processes are required to manufacture the array substrate 100. Since each mask process requires a step of forming a PR (photoresist) layer, a step of exposing the PR layer using an exposing mask, a step of developing the PR layer to form a PR pattern, a step of etching an objective layer using the PR pattern as an etching mask, and a step of stripping the PR pattern, an increasing of a number of mask process generates disadvantages in the production costs and process time.

Figure 8:
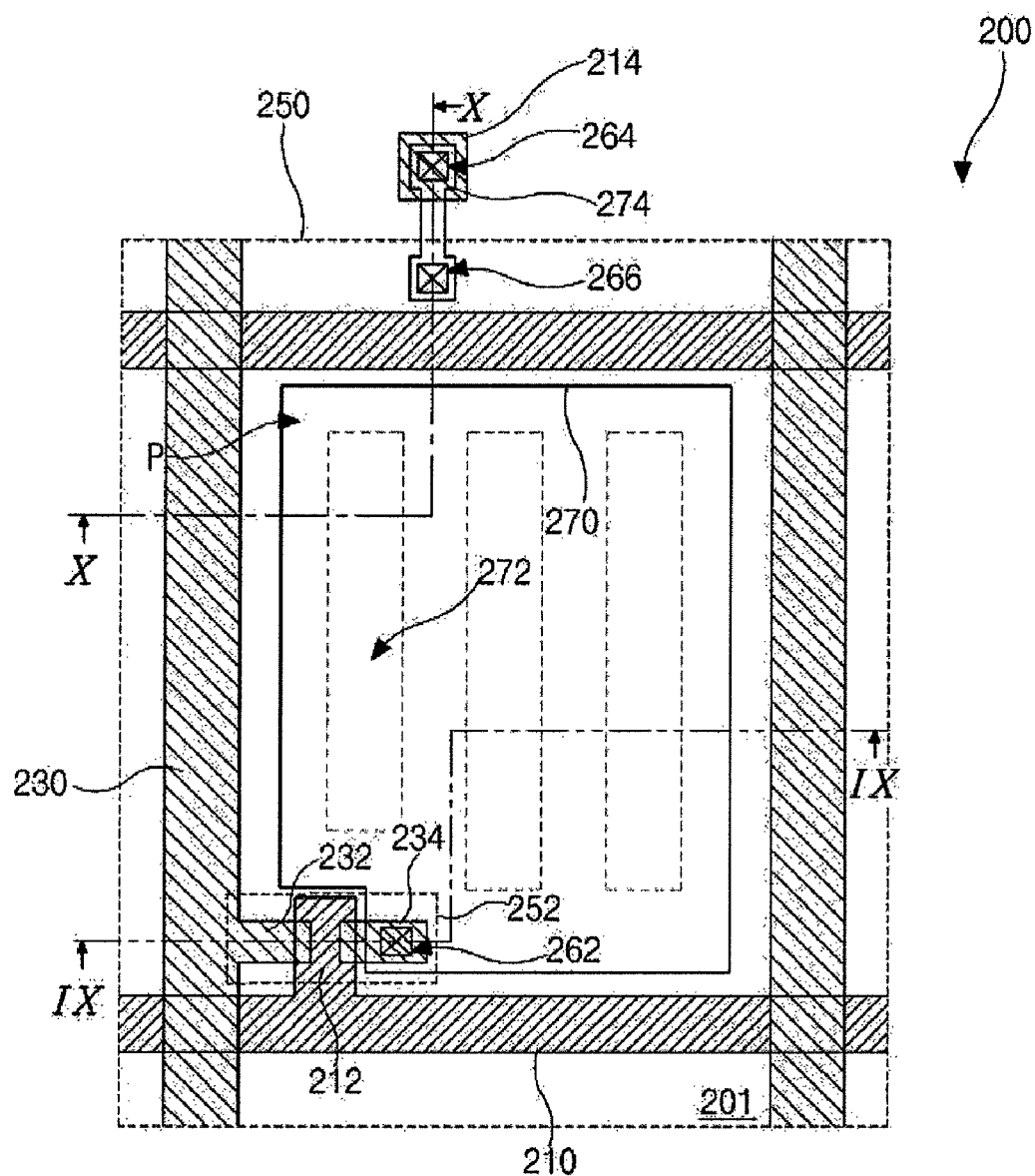
FIG. 8 is a plane view of an array substrate for an FFS mode LCD device according to a second embodiment of the present invention.

To further resolve these problems, an array substrate according a second embodiment of the present invention is introduced. FIG. 8 is a plane view of an array substrate for an FFS mode LCD device according to a second embodiment of the present invention.

Referring to FIG. 8, an array substrate 200 for an FFS mode LCD device includes a gate line 210, a data line 230, a TFT Tr, a pixel electrode 270, a common electrode 250, a common pad 214, a connection pattern 274 on a substrate 201.

The gate line 210 extends along a first direction, and the data line 230 extends along a second direction such that the gate and data lines 210 and 230 cross each other to define a pixel region P. The substrate 201 is classified into a display region for displaying an image and a non-display region at a periphery of the display region. Namely, the display region is surrounded by the outmost gate line 210 and the outmost data line 230. The pixel region P is defined in the display region.

The TFT Tr is disposed in the pixel region P and at a crossing portion of the gate and data lines 210 and 230. The TFT Tr is connected to the gate and data lines 210 and 230.

The TFT Tr includes a gate electrode 212, a gate insulating layer (not shown), a semiconductor layer (not shown), a source electrode 232 and a drain electrode 234. The semiconductor layer includes an active layer (not shown) of intrinsic amorphous silicon and an ohmic contact layer (not shown) of impurity-doped amorphous silicon. Namely, the gate electrode 212 is connected to the gate line 210, and the source electrode 232 is connected to the data line 230.

The common electrode 250 is formed of a transparent conductive material, i.e., indium-tin-oxide (ITO) or indium-zinc-oxide (IZO). The common electrode 250 covers an entire surface of the display region of the substrate 201 and includes a first opening 252 corresponding to the TFT Tr to avoid an electrical interference of the common electrode 250 with the source and drain electrodes 232 and 234 and an electrical connection of the common electrode 250 with the pixel electrode 270. Alternatively, the common electrode 250 can cover an entire surface of the display region without an electrical connection with the pixel electrode 270.

The pixel electrode 270 in the pixel region P is connected to the drain electrode 234 of the TFT Tr through a drain contact hole 262. The pixel electrode 270 is insulated from the common electrode 250 with a passivation layer (not shown) of an insulating material. The pixel electrode 270 in each pixel region P has a plate shape. The pixel electrode 270 has a plurality of second openings 272 corresponding to the common electrode 250. For example, each second opening 272 may has a rectangular shape. Each of the common and pixel electrodes 250 and 270 is formed of a transparent conductive material layer such as indium-tin-oxide (ITO) and indium-zinc-oxide (IZO).

In addition, the common pad 214 for applying a common voltage into the common electrode 250 is disposed in the non-display region. The connection pattern 274 for connecting the common electrode 250 to the common pad 214 is disposed. One end of the connection pattern 274 is connected to the common pad 214 through a first common contact hole 264, and the other end of the connection pattern 274 is connected to the common electrode 250 through a second common contact hole 266. FIG. 8 shows the common pad 214 is disposed between two adjacent data lines 230. Alternatively, the common pad 214 may be disposed at one side of the non-display region to avoid an electrical interference between the common pad 114 and the data line 230.

Although not shown, a gate pad connected to one end of the gate line 210 and a data pad connected to the data line 230 are disposed in the non-display region.

Figure 9:
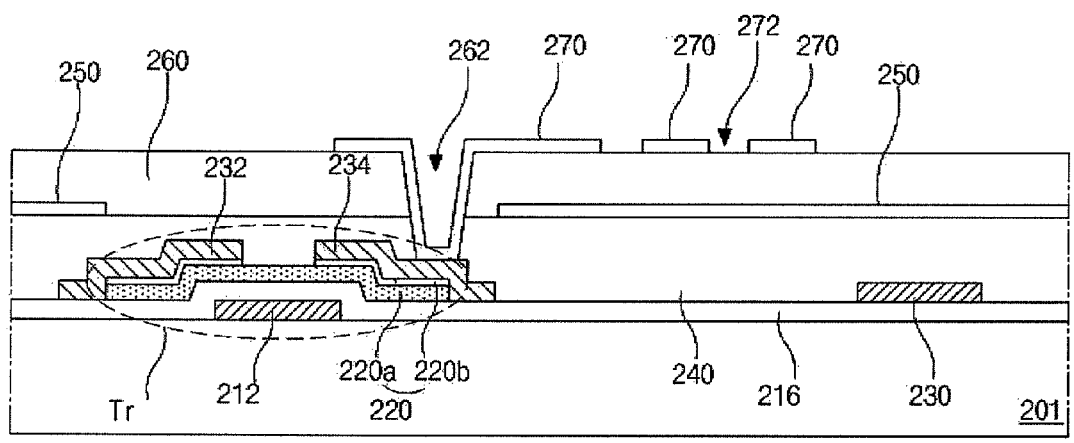
FIG. 9 is a cross-sectional view taken along the line IX-IX of FIG. 8.
Figure 10:
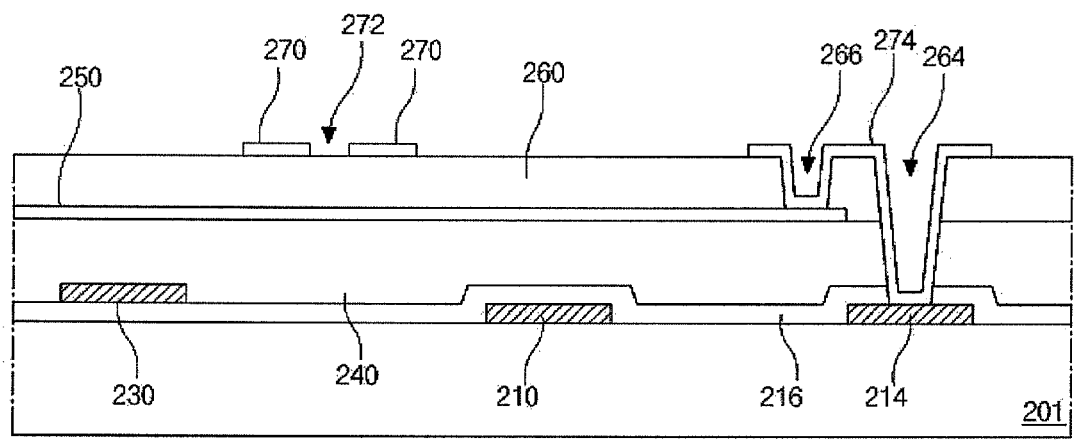
FIG. 10 is a cross-sectional view taken along the line X-X of FIG. 8.

FIG. 9 is a cross-sectional view taken along the line IX-IX of FIG. 8, and FIG. 10 is a cross-sectional view taken along the line X-X of FIG. 8.

Referring to FIGS. 8 to 10, the gate line 210 along the first direction is formed on the substrate 201 and in the display region. The gate electrode 212, which is connected to the gate line 210, is disposed in the pixel region P and on the substrate 201. Namely, the gate electrode 212 extends from the gate line 210. In addition, the common pad 214 is disposed on the substrate 201 and in the non-display region. Although not shown, the gate pad is disposed at one end of the gate line 210.

On the gate line 210, the gate electrode 212 and the common pad 214, the gate insulating layer 216 of an insulating material is disposed. For example, the gate insulating layer 216 is formed of an inorganic insulating material such as silicon oxide and silicon nitride. For example, the gate insulating layer 216 has a thickness of about 3800 angstroms.

On the gate insulating layer 216, the semiconductor layer 220 is disposed. The semiconductor layer 220 includes the active layer 220a of intrinsic amorphous silicon and the ohmic contact layer 220b of impurity-doped amorphous silicon. A center of the active layer 220a is exposed through the ohmic contact layer 220b.

On the semiconductor layer 220, the source electrode 232 and the drain electrode 234, which are spaced apart from each other, are disposed. The center portion of the active layer 220a is also exposed through a space between the source and drain electrodes 232 and 234.

The gate electrode 212, the gate insulating layer 216, the semiconductor layer 220, the source electrode 232 and the drain electrode 234 constitute the TFT Tr.

On the gate insulating layer 216, the data line 230 along the second direction is disposed. The data line 230 crosses the gate line 210 such that the pixel region P is defined. The data line 230 is connected to the source electrode 232 of the TFT Tr. Namely, the data line 230 extends from the source electrode 232. Although not shown, the data pad is formed at one end of the data line 230.

A first passivation layer 240 is disposed to cover the TFT Tr and the data line 230. For example, the first passivation layer 240 is formed of an organic insulating material, for example, photo-acryl or benzocyclobutene (BCB), or an inorganic insulating material, for example, silicon oxide or silicon nitride. For example, the first passivation layer 240 is formed of the inorganic insulating material and has a thickness of about 4000 angstroms.

On the first passivation layer 240, the common electrode 250 of the transparent conductive material is disposed. The common electrode 250 has a plate shape covering an entire surface of the display region including the pixel regions P. The common electrode 250 has the first opening 252 corresponding to the TFT Tr to avoid an electrical connection with the pixel electrode 270 and an electrical interference with the TFT Tr.

A second passivation layer 260 is disposed on the common electrode 250. For example, the second passivation layer 260 is formed of an organic insulating material, for example, photo-acryl or benzocyclobutene (BCB), or an inorganic insulating material, for example, silicon oxide or silicon nitride. For example, the second passivation layer 260 is formed of the inorganic insulating material and has a thickness of about 2000 angstroms.

The drain contact hole 262 exposing the drain electrode 234 is formed through the second passivation layer 260 and the first passivation layer 240. Namely, the first passivation layer 240 and the second passivation layer 260 have the drain contact hole 262 for exposing the drain electrode 234. In addition, the first common contact hole 264 exposing the common pad 214 is formed through the second passivation layer 260 and the first passivation layer 240, and the second common contact hole 266 exposing the common electrode 250 is formed through the second passivation layer 260. Namely, the first passivation layer 240 and the second passivation layer 260 have the first common contact hole 264 for exposing the common pad 214, and the second passivation layer 260 has the second common contact hole 266 for exposing the common electrode 250.

On the second passivation layer 260, the pixel electrode 270 of the transparent conductive material is disposed. The pixel electrode 270 contacts the drain electrode 232 through the drain contact hole 262 such that the pixel electrode 270 is electrically connected to the TFT Tr. The pixel electrode 270 has the second openings 272 corresponding to the common electrode 250. The pixel electrode 270 overlaps the common electrode 250 with the second passivation layer 260 therebetween such that a fringe field is generated between the pixel and common electrodes 270 and 250.

In addition, on the second passivation layer 260, the connection pattern 274 of the transparent conductive material is disposed. One end of the connection pattern 274 is connected to the common pad 214 through the first common contact hole 264, and the other end of the connection pattern 274 is connected to the common electrode 250 through the second common contact hole 266. As a result, the common electrode 250 is electrically connected to the common pad 214 by the connection pattern 274.

In the above array substrate 200 for the FFS mode LCD device according to the present invention, the pixel electrode 270 is spaced apart from the data line 230 with the first and second passivation layers 240 and 260 such that a parasitic capacitance between the pixel electrode 270 and the data line 230 can be reduced. In addition, the common electrode 250 between the pixel electrode 270 and the data line 230 serves as a blocking wall such that the parasitic capacitance between the pixel electrode 270 and the data line 230 can be further reduced.

Furthermore, since the first passivation layer 240 has a thickness greater than the second passivation layer 260, an electrical interference between the common electrode 250 and the data line 230 or/and between the common electrode 250 and the TFT Tr can be decreased. Moreover, since the second passivation layer 260 has a thickness smaller than the first passivation layer 240, an electrical field between the common and pixel electrodes 250 and 270 is strengthened.

Furthermore, since the array substrate 200 is fabricated by a six mask process illustrated below, the production costs and the process time can be reduced.

FIGS. 11A to 11F are cross-sectional views showing a fabricating method of a portion taken along the line IX-IX of FIG. 8, and FIGS. 12A to 12F are cross-sectional views showing a fabricating method of a portion taken along the line X-X of FIG. 8.

Figure 11A:
FIGS. 11A to 11F are cross-sectional views showing a fabricating method of a portion taken along the line IX-IX of FIG. 8.
Figure 12A:
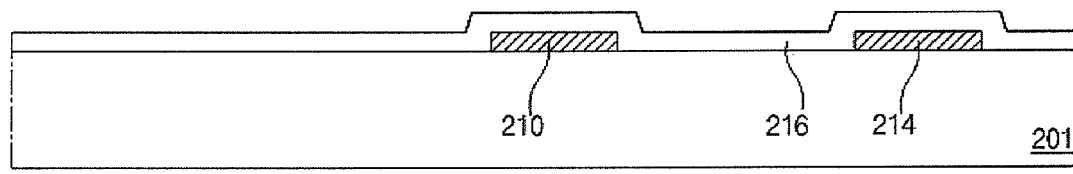
FIGS. 12A to 12F are cross-sectional views showing a fabricating method of a portion taken along the line X-X of FIG. 8.

As shown in FIGS. 11A and 12A, a first metal layer (not shown) is formed on the substrate 201 by depositing a first metallic material. The first metal layer is patterned by a first mask process to form the gate line 210, the gate electrode 212 and the common pad 214. Although not shown, the gate pad is formed at one end of the gat line 210. The first metallic material is a low resistant metal, i.e., aluminum (Al), Al alloy, molybdenum (Mo), copper (Cu) or Cu alloy. The gate line 210, the gate electrode 212 and the common pad 214, which have a single-layered structure, is shown. Alternatively, the gate line 210, the gate electrode 212 and the common pad 214 may have a double-layered structure or a triple-layered structure. For example, the gate line 210, the gate electrode 212 and the common pad 214 may have a lower layer of Al alloy and an upper layer of Mo.

Next, the gate insulating layer 216 is formed on the gate line 210, the gate electrode 212, the common pad 214 and the gate pad by depositing an inorganic insulating material, i.e., silicon oxide or silicon nitride.

Figure 11B:
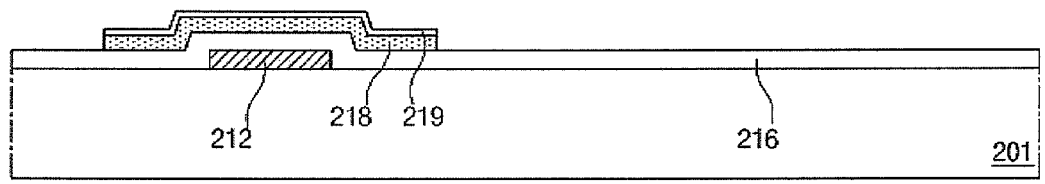
Figure 12B:
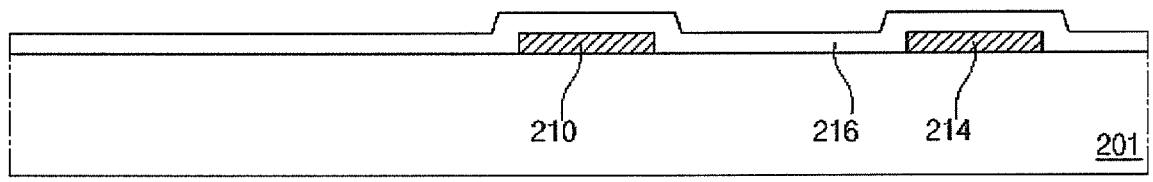

Next, as shown in FIGS. 11B and 12B, an intrinsic amorphous silicon layer (not shown) and an impurity-doped amorphous silicon layer (not shown) are sequentially formed on the gate insulating layer 216 by depositing intrinsic amorphous silicon and impurity-doped amorphous silicon. The impurity-doped amorphous silicon layer and the intrinsic amorphous silicon layer are patterned by a second mask process to form an intrinsic amorphous silicon pattern 218 from the intrinsic amorphous silicon layer and an impurity-doped amorphous silicon pattern 219 from the impurity-doped amorphous silicon layer. The intrinsic amorphous silicon pattern 218 and the impurity-doped amorphous silicon pattern 219 correspond to the gate electrode 212.

Figure 11C:
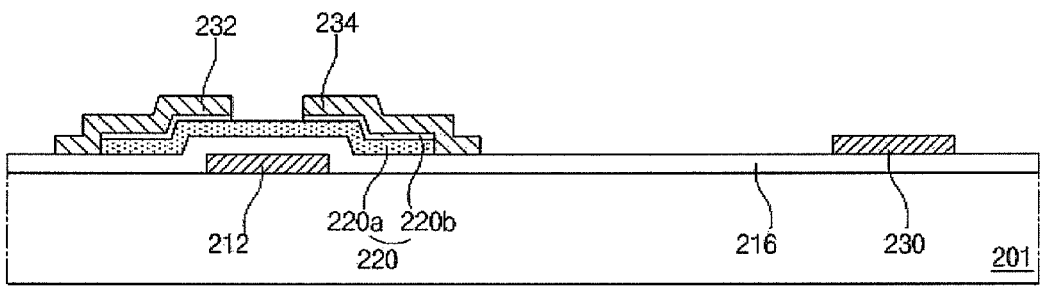
Figure 12C:
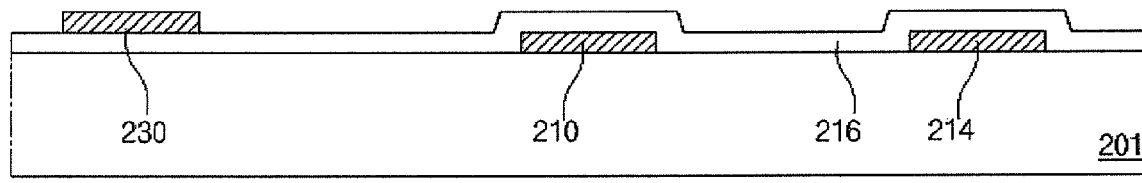

Next, as shown in FIGS. 11C and 12C, a second metal layer (not shown) is formed on the impurity-doped amorphous silicon pattern 219 (of FIG. 11B) and the gate insulating layer 216 by depositing a second metallic material. The second metal layer is patterned by a third mask process to form the data line 230, the source electrode 232 and the drain electrode 234. The data line 230 crosses the gate line 210 to define the pixel region P and extends from the source electrode 232. The source and drain electrodes 232 and 234 are disposed on the impurity-doped amorphous silicon pattern 219 and are spaced apart from each other such that a center of the impurity-doped amorphous silicon pattern 219 (of FIG. 11B) is exposed. Although not shown, the data pad is formed at one end of the data line 230. The second metallic material is a low resistant metal, i.e., Al, Al alloy, Mo, Cu or Cu alloy. The data line 230, the source electrode 232 and the drain electrode 234, which have a single-layered structure, is shown. Alternatively, the data line 230, the source electrode 232 and the drain electrode 234 may have a double-layered structure or a triple-layered structure. For example, the data line 230, the source electrode 232 and the drain electrode 234 may have a lower layer of Al alloy and an upper layer of Mo.

Next, the center of the impurity-doped amorphous silicon pattern 219 (of FIG. 11B), which is exposed through a space between the source and drain electrodes 232 and 234, is etched using the source and drain electrodes 232 and 234 as an etching mask, to form the ohmic contact layer 220$b$. A center of the intrinsic amorphous silicon pattern 218 (of FIG. 11B) is exposed such that the active layer 220$a$ is formed under the ohmic contact layer 220$b$. The active layer 220$a$ and the ohmic contact layer 220$b$ constitute the semiconductor layer 220.

Figure 11D:
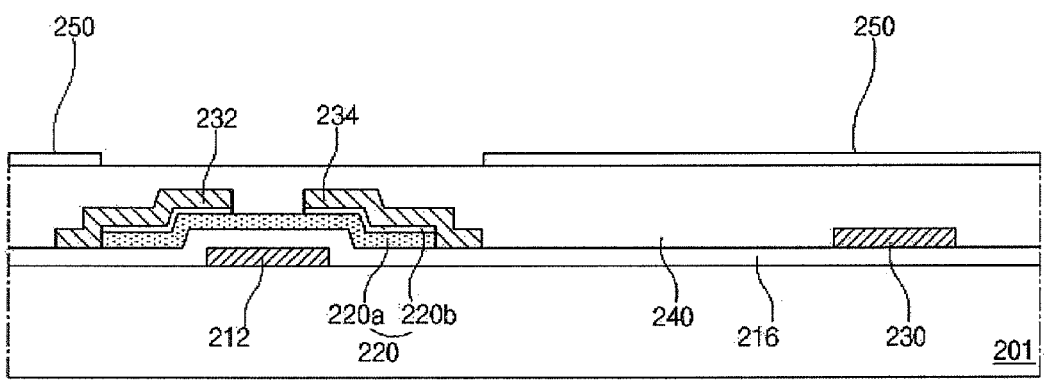
Figure 12D:
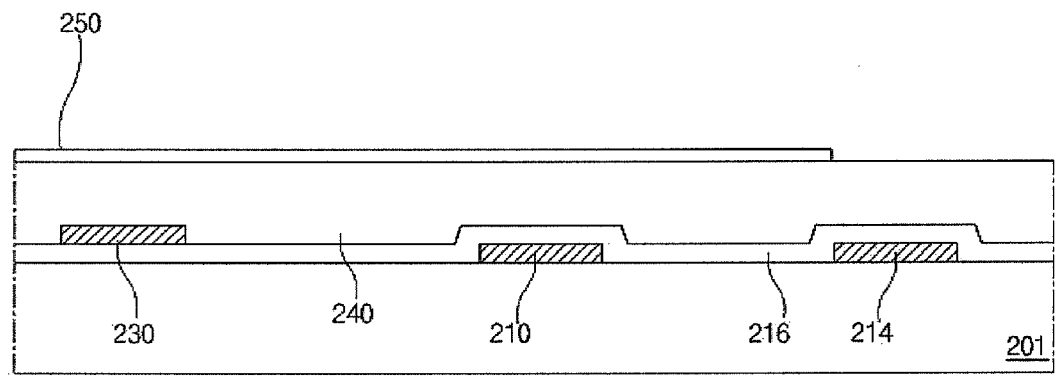

Next, as shown in FIGS. 11D and 12D, the first passivation layer 240 is formed on the data line 230, the source electrode 232 and the drain electrode 234 by depositing an inorganic insulating material, i.e., silicon oxide or silicon nitride, or coating an organic insulating material, i.e., photo-acryl or BCB. The first passivation layer 240 has a thickness of about 4000 angstroms.

Next, a first transparent conductive material layer (not shown) is formed on the first passivation layer 240 by depositing a first transparent conductive material. The first transparent conductive material layer is patterned by a fourth mask process to form the common electrode 250 covering an entire surface of the display region of the substrate 201. The common electrode 250 may has a first opening 252 (of FIG. 8) corresponding to the TFT Tr. A portion of the first transparent conductive material layer corresponding to the drain contact hole 262 should be removed to avoid an electrical connection of the common electrode 250 with the pixel electrode 270. The first transparent conductive material includes ITO or IZO.

Figure 11E:
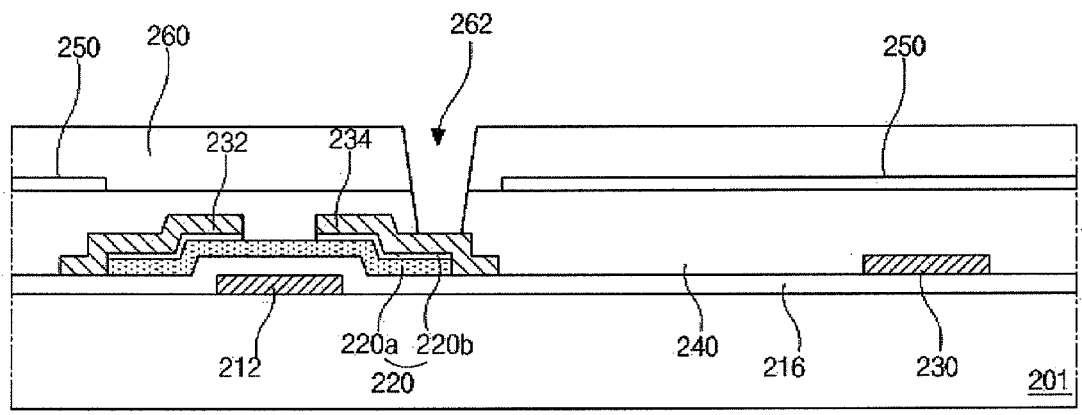
Figure 12E:
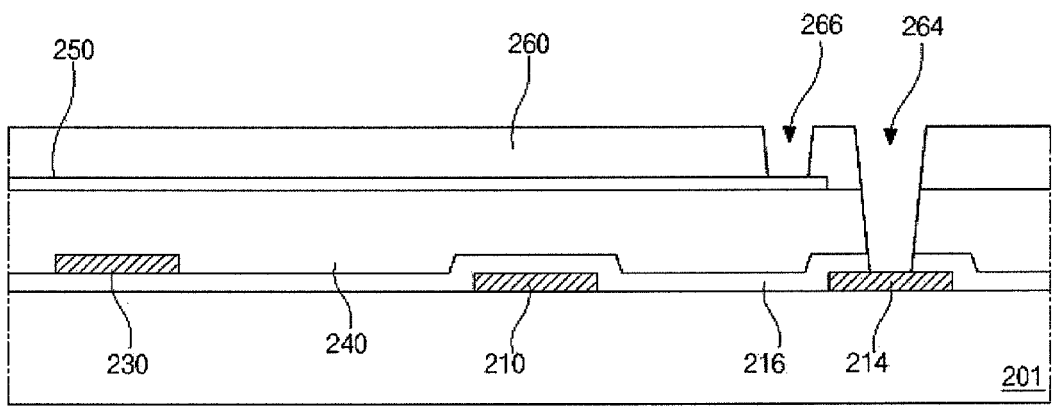

Next, as shown in FIGS. 11E and 12E, the second passivation layer 260 is formed on the common electrode 250 by depositing an inorganic insulating material, i.e., silicon oxide or silicon nitride, or coating an organic insulating material, i.e., photo-acryl or BCB. The second passivation layer 260 has a thickness of about 2000 angstroms. The second passivation layer 260 is patterned by a fifth mask process to form the second common contact hole 266 exposing the common electrode 250. In addition, the second passivation layer 260 and the first passivation layer 240 are patterned by the fifth mask process to form the drain contact hole 262 exposing the drain electrode 234. Furthermore, the second passivation layer 260, the first passivation layer 240 and the gate insulating layer 216 are patterned by the fifth mask process to form the first common contact hole 264 exposing the common pad 214.

Figure 11F:
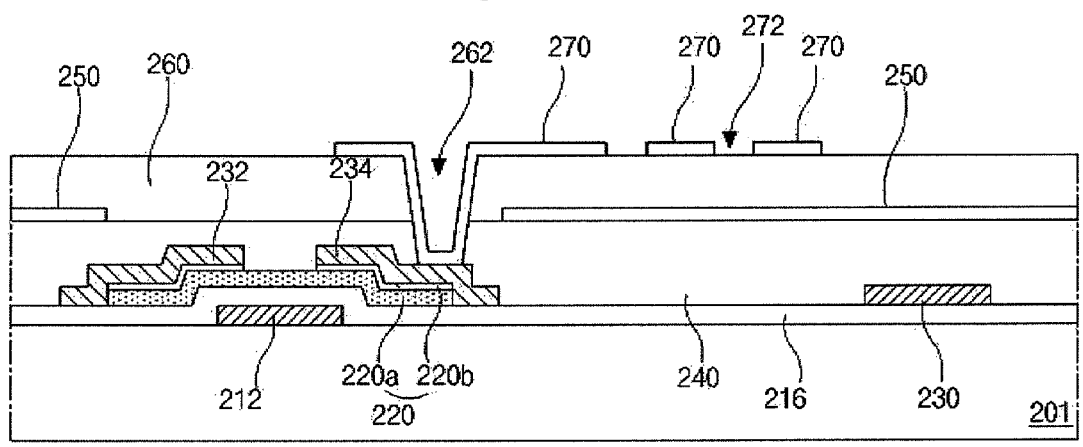
Figure 12F:
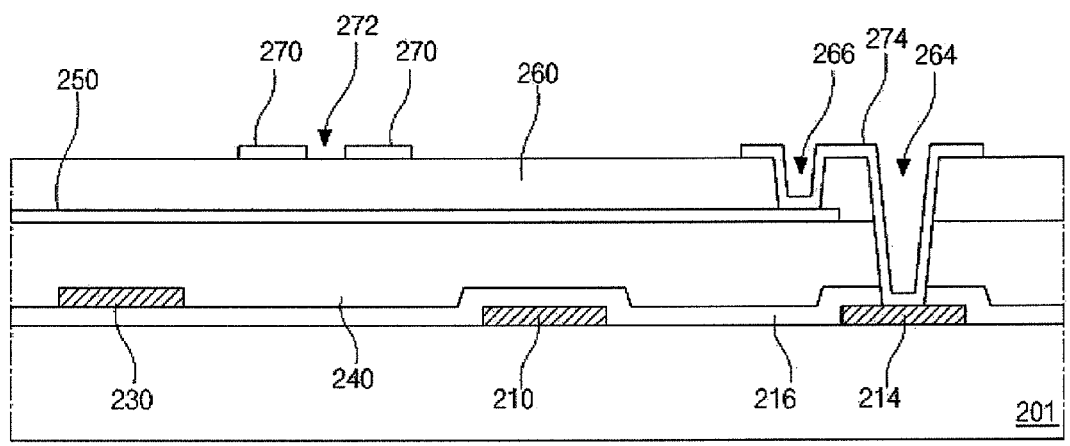

Next, as shown in FIGS. 11F and 12F, a second transparent conductive material layer (not shown) is formed on the second passivation layer 260 by depositing a second transparent conductive material, i.e., ITO or IZO. The second transparent conductive material layer is patterned by a sixth mask process to form the pixel electrode 270 including the second openings 272 and the connection pattern 274. Namely, the connection pattern 274 is formed of the same material and is disposed at the same layer as the pixel electrode 270.

The pixel electrode 270 in each pixel region P has a plate shape, and the second openings 272 overlap the common electrode 250 to generate a fringe field. The pixel electrode 270 contacts the drain electrode 234 through the drain contact hole 262 such that the pixel electrode 270 is electrically connected to the TFT Tr.

As mentioned above, one end of the connection pattern 274 contacts the common pad 214 through the first common contact hole 264, and the other end of the connection pattern 274 is connected to the common electrode 250 through the second common contact hole 266. As a result, the common electrode 250 is electrically connected to the common pad 214 by the connection pattern 274.

Figure 13:
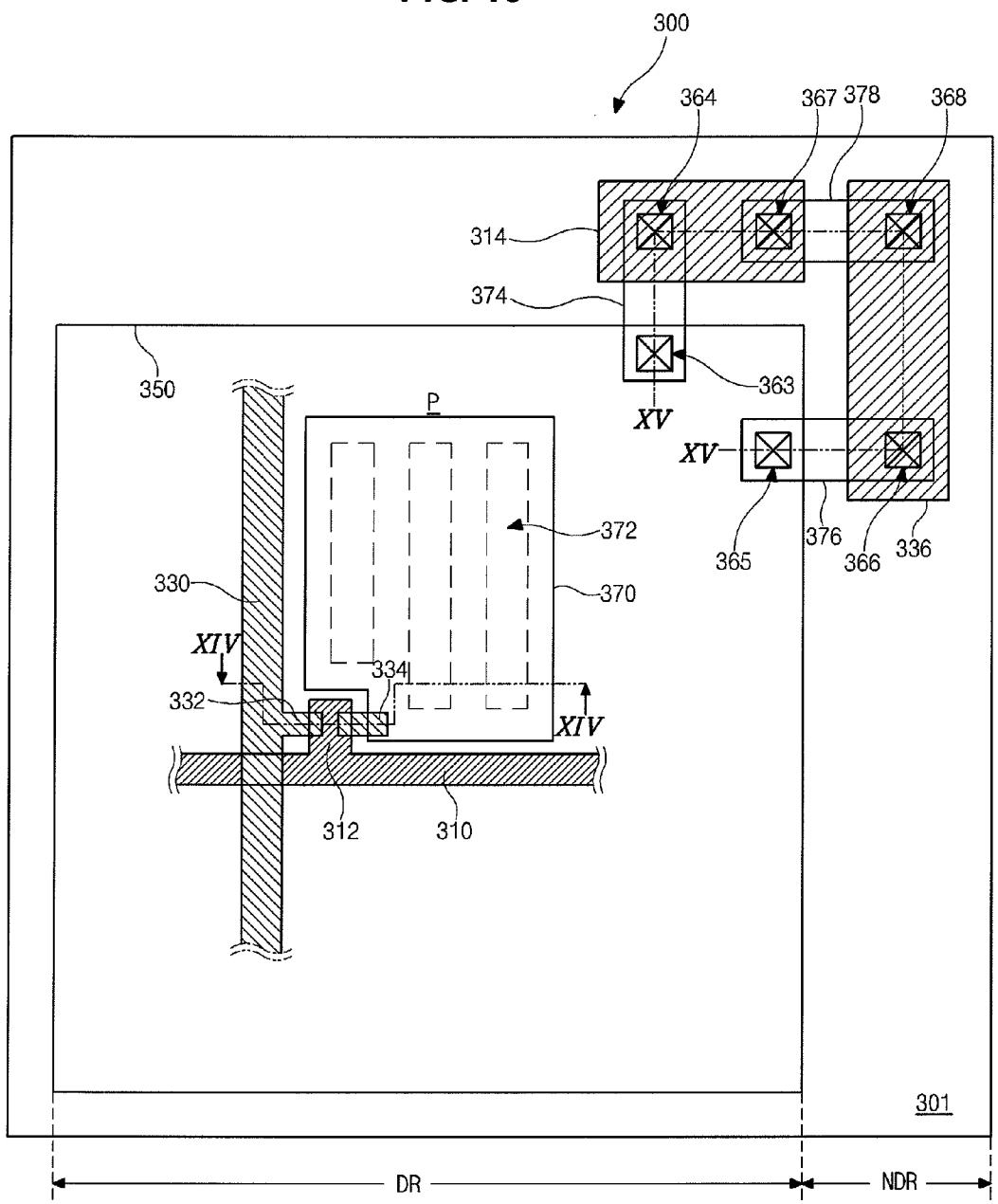
FIG. 13 is a plane view of an array substrate for an FFS mode LCD device according to a third embodiment of the present invention.

FIG. 13 is a plane view of an array substrate for an FFS mode LCD device according to a third embodiment of the present invention. Referring to FIG. 13, an array substrate 300 for an FFS mode LCD device includes a gate line 310, a data line 330, a TFT Tr, a pixel electrode 370, a common electrode 350, a first common pad 314, a second common pad 336, a first connection pattern 374, a second connection pattern 376 and a third connection pattern 378 on a substrate 301. The substrate 301 includes a display region DR for displaying an image and a non-display region NDR at a periphery of the display region DR. A plurality of pixel regions P are defined in the display region DR. The gate line 310, the data line 330, the TFT Tr, the pixel electrode 370, and the common electrode 350 are disposed in the display region DR, and the first and second common pads 314 and 336 are disposed in the non-display region NDR.

The gate line 310 extends along a first direction, and the data line 330 extends along a second direction such that the gate and data lines 310 and 330 cross each other to define the pixel region P. The TFT Tr is disposed in the pixel region P and at a crossing portion of the gate and data lines 310 and 330. The TFT Tr is connected to the gate and data lines 310 and 330. The TFT Tr includes a gate electrode 312, a gate insulating layer (not shown), a semiconductor layer (not shown), a source electrode 332 and a drain electrode 334. The semiconductor layer includes an active layer (not shown) of intrinsic amorphous silicon and an ohmic contact layer (not shown) of impurity-doped amorphous silicon. Namely, the gate electrode 312 is connected to the gate line 310, and the source electrode 332 is connected to the data line 330.

The common electrode 350 is formed of a transparent conductive material, i.e., indium-tin-oxide (ITO) or indium-zinc-oxide (IZO). The common electrode 350 covers an entire surface of the display region DR of the substrate 301. Although not shown, the common electrode 350 includes a first opening corresponding to the TFT Tr to avoid an electrical interference of the common electrode 350 with the source and drain electrodes 332 and 334 and an electrical connection of the common electrode 350 with the pixel electrode 370.

Alternatively, the common electrode 350 can cover an entire surface of the display region DR without an electrical connection with the pixel electrode 370.

The pixel electrode 370 in the pixel region P is connected to the drain electrode 334 of the TFT Tr through a drain contact hole (not shown). The pixel electrode 370 is insulated from the common electrode 350 with a passivation layer (not shown) of an insulating material. The pixel electrode 370 in each pixel region P has a plate shape. The pixel electrode 370 has a plurality of second openings 372 corresponding to the common electrode 350. For example, each second opening 372 may has a rectangular shape. Each of the common and pixel electrodes 350 and 370 is formed of a transparent conductive material layer such as indium-tin-oxide (ITO) and indium-zinc-oxide (IZO).

In addition, the first and second common pads 314 and 336 for applying a common voltage into the common electrode 350 are disposed in the non-display region NDR. In FIG. 13, the first common pad 314 is positioned at an upper portion of the non-display region NDR, and the second common pad 336 is positioned at a right portion of the non-display region NDR. Namely, the first common pad 314 extends to be parallel to the gate line 310, and the second common pad 336 extends to be parallel to the data line 330. However, there is no limitation of a position of the first and second common pads 314 and 336.

The first connection pattern 374 for connecting the common electrode 350 to the first common pad 314, the second connection pattern 376 for connecting the common electrode 350 to the second common pad 336, and the third connection pattern 378 for connecting the first common pad 314 to the second common pad 336 are disposed. One end of the first connection pattern 374 is connected to the common electrode 350 through a first common contact hole 363, and the other end of the first connection pattern 374 is connected to the first common pad 314 through a second common contact hole 364. One end of the second connection pattern 376 is connected to the common electrode 350 through a third common contact hole 365, and the other end of the second connection pattern 376 is connected to the second common pad 336 through a fourth common contact hole 366. One end of the third connection pattern 378 is connected to the first common pad 314 through a fifth common contact hole 367, and the other end of the third connection pattern 378 is connected to the second common pad 336 through a sixth common contact hole 368.

Although not shown, a gate pad connected to one end of the gate line 210 and a data pad connected to the data line 230 are disposed in the non-display region.

In the third embodiment of the present invention, there are two common pads 314 and 336, and the two common pads 314 and 336 are electrically connected. Accordingly, an electrical resistance is reduced such that a signal delay problem is prevented.

Figure 14:
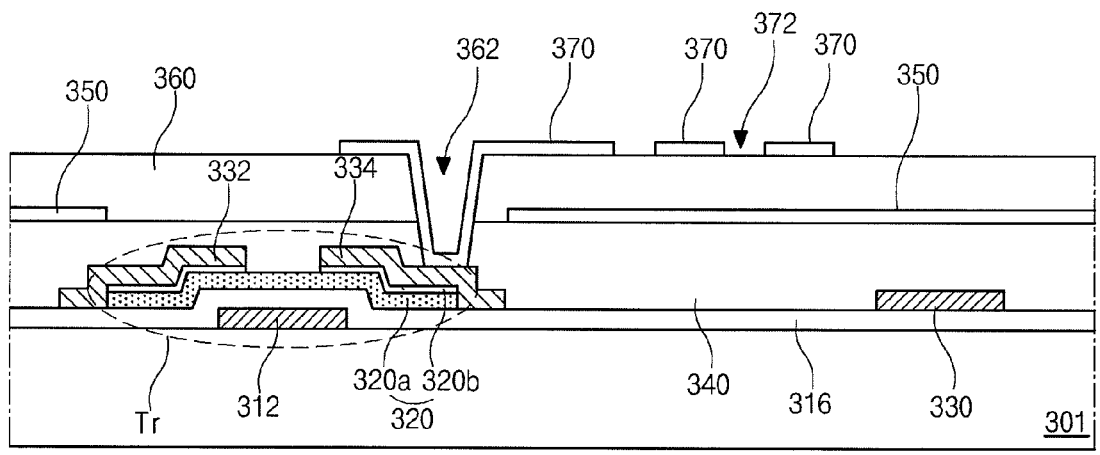
FIG. 14 is a cross-sectional view taken along the line XIV-XIV of FIG. 13.
Figure 15:
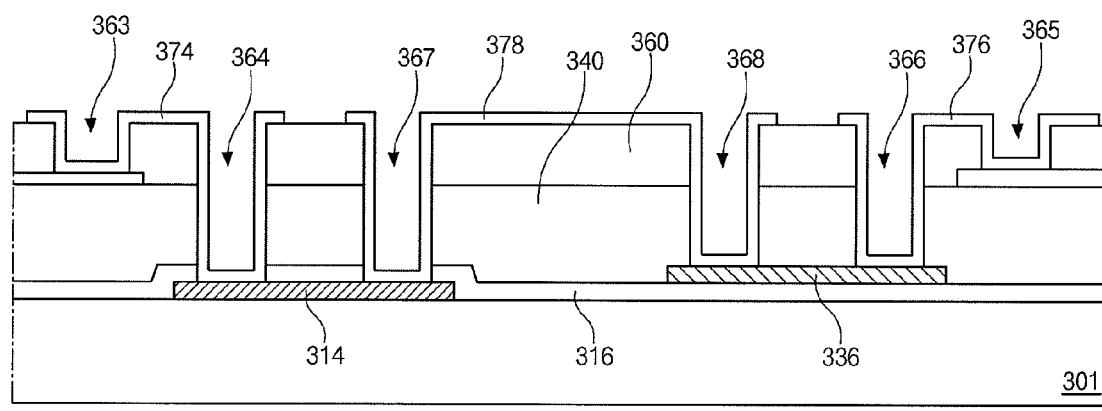
FIG. 15 is a cross-sectional view taken along the line XV-XV of FIG. 13.

FIG. 14 is a cross-sectional view taken along the line XIV-XIV of FIG. 13, and FIG. 15 is a cross-sectional view taken along the line XV-XV of FIG. 13.

Referring to FIGS. 13 to 15, the gate line 310 along the first direction is formed on the substrate 301 and in the display region DR. The gate electrode 312, which is connected to the gate line 310, is disposed in the pixel region P and on the substrate 301. Namely, the gate electrode 312 extends from the gate line 310. In addition, the first common pad 314 is disposed on the substrate 301 and in the non-display region NDR. Although not shown, the gate pad is disposed at one end of the gate line 310.

On the gate line 310, the gate electrode 312 and the first common pad 314, the gate insulating layer 316 of an insulating material is disposed. For example, the gate insulating layer 316 is formed of an inorganic insulating material such as silicon oxide and silicon nitride. For example, the gate insulating layer 316 has a thickness of about 3800 angstroms.

On the gate insulating layer 316, the semiconductor layer 320 is disposed. The semiconductor layer 320 includes the active layer 320*a* of intrinsic amorphous silicon and the ohmic contact layer 320*b* of impurity-doped amorphous silicon. A center of the active layer 320*a* is exposed through the ohmic contact layer 320*b*.

On the semiconductor layer 320, the source electrode 332 and the drain electrode 334, which are spaced apart from each other, are disposed. The center portion of the active layer 320*a* is also exposed through a space between the source and drain electrodes 332 and 334.

The gate electrode 312, the gate insulating layer 316, the semiconductor layer 320, the source electrode 332 and the drain electrode 334 constitute the TFT Tr.

On the gate insulating layer 316, the data line 330 along the second direction is disposed. The data line 330 crosses the gate line 310 such that the pixel region P is defined. The data line 330 is connected to the source electrode 332 of the TFT Tr. Namely, the data line 330 extends from the source electrode 332. Although not shown, the data pad is formed at one end of the data line 330.

In addition, the second common pad 336 is disposed on the gate insulating layer 316 and in the non-display region NDR. Namely, the second common pad 336 is disposed at the same layer and formed of the same material as the data line 330. The second common pad 336 is spaced apart from the first common pad 314.

A first passivation layer 340 is disposed to cover the TFT Tr, the data line 330 and the second common pad 336. For example, the first passivation layer 340 is formed of an organic insulating material, for example, photo-acryl or benzocyclobutene (BCB), or an inorganic insulating material, for example, silicon oxide or silicon nitride. For example, the first passivation layer 340 is formed of the inorganic insulating material and has a thickness of about 4000 angstroms.

On the first passivation layer 340, the common electrode 350 of the transparent conductive material is disposed. The common electrode 350 has a plate shape covering an entire surface of the display region including the pixel regions P. The common electrode 350 has the first opening (not shown) corresponding to the TFT Tr to avoid an electrical connection with the pixel electrode 370 and an electrical interference with the TFT Tr.

A second passivation layer 360 is disposed on the common electrode 350. For example, the second passivation layer 360 is formed of an organic insulating material, for example, photo-acryl or benzocyclobutene (BCB), or an inorganic insulating material, for example, silicon oxide or silicon nitride. For example, the second passivation layer 360 is formed of the inorganic insulating material and has a thickness of about 2000 angstroms.

The drain contact hole 362 exposing the drain electrode 334 is formed through the second passivation layer 360 and the first passivation layer 340. Namely, the first passivation layer 340 and the second passivation layer 360 have the drain contact hole 362 for exposing the drain electrode 334. In addition, the first common contact hole 363 exposing one portion of the common electrode 350 and the third common contact hole 365 exposing the other one portion of the common electrode 350 are formed through the second passivation layer 360. The second common contact hole 364 exposing one portion of the first common pad 314 and the fifth common contact hole 367 exposing the other portion of the first common pad 314 are formed through the gate insulating layer 316, the first passivation layer 340 and the second passivation layer 360. The fourth common contact hole 366 exposing one portion of the second common pad 336 and the sixth common contact hole 368 exposing the other portion of the second common pad 336 are formed through the first and second passivation layers 340 and 360. Namely, the second passivation layer 360 has the first and third common contact holes 363 and 365 for exposing the one end and the other one end of the common electrode 350, respectively. The gate insulating layer 316, the first passivation layer 340 and the second passivation layer 360 have the second and fifth common contact holes 364 and 367 for exposing the one end and the other one end of the first common pad 314, respectively. The first and second passivation layers 340 and 360 have the fourth and sixth common contact holes 366 and 368 for exposing the one end and the other one end of the second common pad 336, respectively.

On the second passivation layer 360, the pixel electrode 370 of the transparent conductive material is disposed. The pixel electrode 370 contacts the drain electrode 332 through the drain contact hole 362 such that the pixel electrode 370 is electrically connected to the TFT Tr. The pixel electrode 370 has the second openings 372 corresponding to the common electrode 350. The pixel electrode 370 overlaps the common electrode 350 with the second passivation layer 360 therebetween such that a fringe field is generated between the pixel and common electrodes 370 and 350.

In addition, on the second passivation layer 360, the first to third connection patterns 374, 376 and 378 of the transparent conductive material are disposed.

One end of the first connection pattern 374 is connected to the common electrode 350 through the first common contact hole 363, and the other end of the first connection pattern 374 is connected to the first common pad 314 through the second common contact hole 364. One end of the second connection pattern 376 is connected to the common electrode 350 through the third common contact hole 365, and the other end of the second connection pattern 376 is connected to the second common pad 336 through the fourth common contact hole 366. One end of the third connection pattern 378 is connected to the first common pad 314 through the fifth common contact hole 367, and the other end of the third connection pattern 378 is connected to the second common pad 336 through a sixth common contact hole 368. As a result, the common electrode 250, the first common pad 314 and the second common pad 336 are electrically connected to one another by the first to third connection patterns 274, 276 and 278.

In the above array substrate 300 for the FFS mode LCD device according to the present invention, the pixel electrode 370 is spaced apart from the data line 330 with the first and second passivation layers 340 and 360 such that a parasitic capacitance between the pixel electrode 370 and the data line 330 can be reduced. In addition, the common electrode 350 between the pixel electrode 370 and the data line 330 serves as a blocking wall such that the parasitic capacitance between the pixel electrode 370 and the data line 330 can be further reduced.

Furthermore, since the first passivation layer 340 has a thickness greater than the second passivation layer 360, an electrical interference between the common electrode 350 and the data line 330 or/and between the common electrode 350 and the TFT Tr can be decreased. Moreover, since the second passivation layer 360 has a thickness smaller than the first passivation layer 340, an electrical field between the common and pixel electrodes 350 and 370 is strengthened.

Furthermore, due to the first and second common pads 314 and 336, and the first to third connection patterns 374, 376 and 378, a signal delay is prevented. Since the array substrate 300 is fabricated by a six mask process illustrated below, the production costs and the process time can be reduced.

Referring to FIGS. 13 to 15, a fabricating method of the array substrate according to the third embodiment is explained below.

First, a first metal layer (not shown) is formed on the substrate 301 by depositing a first metallic material. The first metal layer is patterned by a first mask process to form the gate line 310, the gate electrode 312 and the first common pad 314. Although not shown, the gate pad is formed at one end of the gat line 310. The first metallic material is a low resistant metal, i.e., aluminum (Al), Al alloy, molybdenum (Mo), copper (Cu) or Cu alloy.

Next, the gate insulating layer 316 is formed on the gate line 310, the gate electrode 312, the common pad 314 and the gate pad by depositing an inorganic insulating material, i.e., silicon oxide or silicon nitride.

Next, an intrinsic amorphous silicon layer (not shown) and an impurity-doped amorphous silicon layer (not shown) are sequentially formed on the gate insulating layer 316 by depositing intrinsic amorphous silicon and impurity-doped amorphous silicon. The impurity-doped amorphous silicon layer and the intrinsic amorphous silicon layer are patterned by a second mask process to form an intrinsic amorphous silicon pattern (not shown) from the intrinsic amorphous silicon layer and an impurity-doped amorphous silicon pattern (not shown) from the impurity-doped amorphous silicon layer. The intrinsic amorphous silicon pattern and the impurity-doped amorphous silicon pattern 219 correspond to the gate electrode.

Next, a second metal layer (not shown) is formed on the impurity-doped amorphous silicon pattern and the gate insulating layer 316 by depositing a second metallic material. The second metal layer is patterned by a third mask process to form the data line 330, the source electrode 332, the drain electrode 334 and the second common pad 336. Although not shown, the data pad is formed at one end of the data line 330. The second metallic material is a low resistant metal, i.e., Al, Al alloy, Mo, Cu or Cu alloy.

Next, the center of the impurity-doped amorphous silicon pattern, which is exposed through a space between the source and drain electrodes 332 and 334, is etched using the source and drain electrodes 332 and 334 as an etching mask, to form the ohmic contact layer 320b. A center of the intrinsic amorphous silicon pattern is exposed such that the active layer 320a is formed under the ohmic contact layer 320b. The active layer 320a and the ohmic contact layer 320b constitute the semiconductor layer 320.

Next, the first passivation layer 340 is formed on the data line 330, the source electrode 332, the drain electrode 334 and the second common pad 336 by depositing an inorganic insulating material, i.e., silicon oxide or silicon nitride, or coating an organic insulating material, i.e., photo-acryl or BCB. The first passivation layer 340 has a thickness of about 4000 angstroms.

Next, a first transparent conductive material layer (not shown) is formed on the first passivation layer 340 by depositing a first transparent conductive material. The first transparent conductive material layer is patterned by a fourth mask process to form the common electrode 350 covering an entire surface of the display region DR of the substrate 301. The common electrode 350 may has a first opening (not shown)) corresponding to the TFT Tr. A portion of the first transparent conductive material layer corresponding to the drain contact hole 362 should be removed to avoid an electrical connection of the common electrode 350 with the pixel electrode 370. The first transparent conductive material includes ITO or IZO.

Next, the second passivation layer 360 is formed on the common electrode 350 by depositing an inorganic insulating material, i.e., silicon oxide or silicon nitride, or coating an organic insulating material, i.e., photo-acryl or BCB. The second passivation layer 360 has a thickness of about 3000 angstroms. The second passivation layer 360 is patterned by a fifth mask process to form the first and third common contact holes 363 and 365 respectively exposing portions of the common electrode 350. The second passivation layer 360 and the first passivation layer 340 are patterned by the fifth mask process to form the drain contact hole 262 exposing the drain electrode 234 and the fourth and sixth common contact holes 366 and 368 respectively exposing portions of the second common pad 336. Furthermore, the second passivation layer 360, the first passivation layer 340 and the gate insulating layer 316 are patterned by the fifth mask process to form the second and fifth common contact holes 364 and 367 respectively exposing the first common pad 314.

Next, a second transparent conductive material layer (not shown) is formed on the second passivation layer 360 by depositing a second transparent conductive material, i.e., ITO or IZO. The second transparent conductive material layer is patterned by a sixth mask process to form the pixel electrode 370 including the second openings 372 and the first to third connection patterns 374, 376 and 378. Namely, each of the first to third connection patterns 374, 376 and 378 is formed of the same material and is disposed at the same layer as the pixel electrode 370. As mentioned above, the common electrode 350, the first common pad 314 and the second common pad 336 are electrically connected to one another by the first to third connection patterns 374, 376 and 378.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate for a fringe field switching mode liquid crystal display device, comprising:
   a substrate including a display region and a non-display region at a periphery of the display region;
   a gate line on the substrate and in the display region;
   a common pad on the substrate and in the non-display region;
   a gate insulating layer on the gate line and the common pad;
   a data line on the gate insulating layer and crossing the gate line to define a pixel region in the display region;
   a thin film transistor connected to the gate and data lines and positioned in the pixel region;
   a first passivation layer on the data line and the thin film transistor;
   a common electrode on the first passivation layer and covering an entire surface of the display region except for a portion above the thin film transistor;
   a second passivation layer on the common electrode; and
   a pixel electrode on the second passivation layer and having a plate shape in each pixel region, the pixel electrode connected to the thin film transistor and having at least one opening.

2. The array substrate according to claim 1, further comprising a connection pattern for connecting the common electrode to the common pad and disposed on the second passivation layer.

3. The array substrate according to claim 2, wherein one end of the connection pattern contacts the common pad through a first common contact hole exposing the common pad, and the other end of the connection pattern contacts the common electrode through a second common contact hole exposing the common electrode.

4. The array substrate according to claim 3, wherein the first common contact hole is formed through the gate insulating layer, the first passivation layer and the second passivation layer, and the second common contact hole is formed through the second passivation layer.

5. The array substrate according to claim 2, wherein the connection pattern is formed of the same material as the pixel electrode.

6. The array substrate according to claim 2, wherein each of the common electrode, the pixel electrode and the common pad is formed of a transparent conductive material including one of indium-tin-oxide and indium-zinc-oxide.

7. The array substrate according to claim 1, wherein the first passivation layer has a thickness greater than the second passivation layer.

8. The array substrate according to claim 7, wherein the thickness of the first passivation layer is about 4000 angstroms, and the thickness of the second passivation layer is about 2000 angstroms.

9. A method of fabrication an array substrate for a fringe field switching mode liquid crystal display device, comprising:
   forming a gate line, a gate electrode and a common pad on a substrate including a display region and a non-display region at a periphery of the display region, the gate line disposed in the display region and the common pad disposed in the non-display region;
   forming a gate insulating layer on the gate line, the gate electrode and the common pad;
   forming a data line, which is disposed on the gate insulating layer and crosses the gate line to define a pixel region in the display region, and a thin film transistor in the pixel region, the thin film transistor connected to the gate and data lines;
   forming a first passivation layer on the data line and the thin film transistor;
   forming a common electrode on the first passivation layer and covering an entire surface of the display region except for a portion above the thin film transistor;
   forming a second passivation layer on the common electrode;
   forming a first common contact hole exposing the common pad, a second common contact hole exposing the common electrode and a drain contact hole exposing a portion of the thin film transistor;
   forming a pixel electrode on the second passivation layer and having a plate shape in each pixel region, the pixel electrode connected to the thin film transistor through the drain contact hole and having at least one opening; and
   forming a connection pattern for connecting the common electrode to the common pad and disposed on the second passivation layer.

10. The method according to claim 9, wherein one end of the connection pattern contacts the common pad through the first common contact hole, and the other end of the connection pattern contacts the common electrode through the second common contact hole.

11. The method according to claim 9, wherein the connection pattern is formed of the same material as the pixel electrode.

12. The method according to claim 9, wherein each of the common electrode, the pixel electrode and the common pad is formed of a transparent conductive material including one of indium-tin-oxide and indium-zinc-oxide.

13. The method according to claim 9, wherein the first passivation layer has a thickness greater than the second passivation layer.

14. The method according to claim 13, wherein the thickness of the first passivation layer is about 4000 angstroms, and the thickness of the second passivation layer is about 2000 angstroms.

15. The method according to claim 9, wherein the step of forming a first common contact hole exposing the common pad, a second common contact hole exposing the common electrode and a drain contact hole exposing a portion of the thin film transistor is performed by a single mask process.

16. The method according to claim 9, wherein the step of forming the pixel electrode and the connection pattern is performed by a single mask process.

17. An array substrate for a fringe field switching mode liquid crystal display device, comprising:
   a substrate including a display region and a non-display region at a periphery of the display region;
   a gate line and a gate electrode connected to the gate line on the substrate and in the display region;
   a first common pad on the substrate and in the non-display region;
   a gate insulating layer on the gate line, gate electrode and the first common pad;
   a data line and a source electrode connected to the data line on the gate insulating layer and the data line crossing the gate line to define a pixel region in the display region;
   a second common pad on the gate insulating layer and in the non-display region;
   a thin film transistor connected to the gate and data lines and positioned in the pixel region;
   a first passivation layer on the data line, the second common pad and the thin film transistor;
   a common electrode on the first passivation layer and covering an entire surface of the display region except for a portion above the thin film transistor;
   a second passivation layer on the common electrode;
   a pixel electrode on the second passivation layer and having a plate shape in each pixel region, the pixel electrode connected to the thin film transistor and having at least one opening;
   a first connection pattern for connecting the common electrode to the first common pad and disposed on the second passivation layer;
   a second connection pattern for connecting the common electrode to the second common pad and disposed on the second passivation layer; and
   a third connection pattern for connecting the first common pad to the second common pad and disposed on the second passivation layer.

18. The array substrate according to claim 17, wherein one end of the first connection pattern contacts the common electrode through a first contact hole exposing the common electrode, and the other end of the first connection pattern contacts the first common pad through a second contact hole exposing the first common pad.

19. The array substrate according to claim 18, wherein the first contact hole is formed through the second passivation layer, and the second contact hole is formed through the gate insulating layer, the first passivation layer and the second passivation layer.

20. The array substrate according to claim 17, wherein one end of the second connection pattern contacts the common electrode through a third contact hole exposing the common electrode and the other end of the second connection pattern contacts the second common pad through a fourth contact hole exposing the second common pad.

21. The array substrate according to claim 20, wherein the third contact hole is formed through the second passivation layer, and the fourth contact hole is formed through the first passivation layer and the second passivation layer.

22. The array substrate according to claim 17, wherein one end of the third connection pattern contacts the first common pad through a fifth contact hole exposing the first common pad and the other end of the third connection pattern contacts the second common pad through a sixth contact hole exposing the second common pad.

23. The array substrate according to claim 22, wherein the fifth contact hole is formed through the gate insulating layer, the first passivation layer and the second passivation layer, and the sixth contact hole is formed through the first passivation layer and the second passivation layer.

24. The array substrate according to claim 17, wherein the first common pad is parallel with the gate line and the second common pad is parallel with the data line.

25. The array substrate according to claim 17, wherein the first, second and third connection patterns are formed of the same material as the pixel electrode.

26. The array substrate according to claim 17, wherein the gate line and the first common pad are formed of the same material as the gate electrode, and the data line and the second common pad are formed of the same material as the source electrode.

27. A method of fabrication an array substrate for a fringe field switching mode liquid crystal display device, comprising:
forming a gate line, a gate electrode and a first common pad on a substrate including a display region and a non-display region at a periphery of the display region, the gate line disposed in the display region and the first common pad disposed in the non-display region;
forming a gate insulating layer on the gate line, the gate electrode and the first common pad;
forming a data line, which is disposed on the gate insulating layer and crosses the gate line to define a pixel region in the display region, a second common pad, which is disposed on the gate insulating layer in the non-display region, and a thin film transistor in the pixel region, the thin film transistor connected to the gate and data lines;
forming a first passivation layer on the data line, the second common pad and the thin film transistor;
forming a common electrode on the first passivation layer and covering an entire surface of the display region except for a portion above the thin film transistor;
forming a second passivation layer on the common electrode;
forming a first contact hole exposing one portion of the common electrode, a second contact hole exposing one portion of the first common pad, a third contact hole exposing another portion of the common electrode, a fourth contact hole exposing one portion of the second common pad, a fifth contact hole exposing another portion of the first common pad, a sixth contact hole exposing another portion of the second common pad and a drain contact hole exposing a portion of the thin film transistor; and
forming a pixel electrode on the second passivation layer and in each pixel region and first to third connection patterns on the second passivation layer, the pixel electrode connected to the thin film transistor through the drain contact hole and having at least one opening, the first connection pattern connecting the common electrode to the first common pad through the first and second contact holes, the second connection pattern connecting the common electrode to the second common pad through the third and fourth contact holes, and the third connection pattern connecting the first common pad to the second common pad through the fifth and sixth contact holes.

28. The method according to claim 27, wherein the step of forming the first contact hole, the second contact hole, the third contact hole, the fourth contact hole, the fifth contact hole , the sixth contact hole and the drain contact hole is performed by a single mask process.

29. The method according to claim 27, wherein the step of forming the pixel electrode and the first to third connection patterns is performed by a single mask process.

* * * * *